(12) United States Patent
Nakata

(10) Patent No.: US 7,375,018 B2
(45) Date of Patent: May 20, 2008

(54) METHOD OF MANUFACTURING SEMICONDUCTOR DEVICE

(75) Inventor: Hidetoshi Nakata, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 178 days.

(21) Appl. No.: 11/364,051

(22) Filed: Mar. 1, 2006

(65) Prior Publication Data

US 2006/0199391 A1    Sep. 7, 2006

(30) Foreign Application Priority Data

Mar. 2, 2005    (JP) .............................. 2005-057330

(51) Int. Cl.
*H01L 21/44* (2006.01)

(52) U.S. Cl. ..................... 438/597; 438/702; 438/257; 438/258; 438/264; 438/942

(58) Field of Classification Search ................ 438/702, 438/257–258, 264, 597, 942
See application file for complete search history.

(56) References Cited

U.S. PATENT DOCUMENTS 6,489,201 B2 * 12/2002 Yoon .......................... 438/257

2005/0167759 A1 * 8/2005 Matsui et al. ................ 257/390

FOREIGN PATENT DOCUMENTS

JP    2002-280388 A    9/2002

* cited by examiner

*Primary Examiner*—Kiesha Rose
*Assistant Examiner*—Eric W Jones
(74) *Attorney, Agent, or Firm*—Sughrue Mion, PLLC

(57) ABSTRACT

Etching is performed on an insulating layer 23 and a conductive layer 32 with a photoresist 41 as the mask, to form an opening 51 in the conductive layer 32. After removing the photoresist 41, another insulating layer 24 is formed all over, which is etched back so as to expose a surface of a conductive layer 31, to thereby cover the inner wall of the opening 51. Then etching is performed on the conductive layer 31 with the latter insulating layer 24 as the mask, so as to form another opening 52 in the conductive layer 31. Then still another insulating layer 25 is formed all over, which is then etched back so as to expose a surface of the conductive layer 32, to thereby fill the opening 52 with the last formed insulating layer 25.

3 Claims, 8 Drawing Sheets

METHOD OF MANUFACTURING SEMICONDUCTOR DEVICE

This application is based on Japanese patent application No. 2005-057330, the content of which is incorporated hereinto by reference.

BACKGROUND

1. Technical Field

The present invention relates to a method of manufacturing a semiconductor device.

2. Related Art

Referring to FIGS. 6A to 6C, a conventional interconnect formation process will be reviewed. Firstly an insulating film 121 and a conductive film 131 are sequentially formed on a semiconductor substrate 101. The insulating film 121 may be an oxide film formed through a thermal oxidation process, and the conductive film 131 may be a polycrystalline silicon film formed by CVD (Chemical Vapor Deposition). Then a photoresist 141 is laid over the conductive film 131, and a pattern is delineated on the photoresist 141 by photolithography (FIG. 6A). Here, the space width of the photoresist is equal to the line width d.

Then a dry etching process is performed on the conductive film 131 utilizing the photoresist 141 as the mask (FIG. 6B). After removing the photoresist 141, an insulating film 122 constituted of an oxide film, which serves as an interlayer dielectric, is formed for example by CVD. That is how an interconnect constituted of the conductive film 131 is formed (FIG. 6C).

In addition, Japanese Laid-open Patent Publication No. 2002-280388 (referred to as "Patent Document 1" below) discloses an interconnect formation process. The interconnect formation process according to Patent Document 1 will be described referring to FIGS. 7A to 7C and 8A to 8C. Firstly an insulating film 121, a conductive film 131, and another insulating film 123 which is an oxide film, are sequentially formed on a semiconductor substrate 101. Then a photoresist 141 is laid over the insulating film 123, and a pattern is delineated on the photoresist 141 by photolithography (FIG. 7A). Here, the space width of the photoresist 141 is three times of the line width d.

Then an etching process is performed on the insulating film 123 utilizing the photoresist 141 as the mask (FIG. 7B). After removing the photoresist 141, an insulating film 161 constituted of a nitride film is formed all over the substrate, and the insulating film 161 is etched back by anisotropic etching, so as to expose a surface of the conductive film 131 (FIG. 7C).

The insulating film 123 which is an oxide film is then removed (FIG. 8A), after which an etching process is performed on the conductive film 131 utilizing the insulating film 161 as the mask (FIG. 8B). After removing the insulating film 161, an insulating film 124 constituted of an oxide film; which serves as an interlayer dielectric, is formed for example by CVD. At this stage, an interconnect constituted of the conductive film 131 is formed (FIG. 8C).

SUMMARY OF THE INVENTION

By such conventional methods, however, the line width and the space width of the interconnect become equal to the line width d of the photoresist 141. Whereas, the minimum value of the line width d depends on the performance level of the photolithography technique, more specifically on the capacity of the exposure equipment to be employed. Accordingly, forming an interconnect in a finer scale by the conventional method requires employing a higher-quality exposure equipment, which is naturally more expensive, thus resulting in an increase of the manufacturing cost.

According to the present invention, there is provided a method of manufacturing a semiconductor device, comprising: preparing a semiconductor substrate on which a first layer constituted of a conductive film, a second layer constituted of an insulating film, and a third layer having etching selectivity from the second layer are sequentially formed; forming a first upper opening in the third layer; forming a first mask insulating film so as to cover an inner wall of the first upper opening; forming a first lower opening in the first layer so as to communicate with the first upper opening, utilizing the first mask insulating film as the mask; forming a first buried insulating film so as to fill the first lower opening; forming a second upper opening by selectively removing the third layer by etching, after the forming of the first buried insulating film; forming a second mask insulating film so as to cover an inner wall of the second upper opening; forming a second lower opening in the first layer so as to communicate with the second upper opening, utilizing the second mask insulating film as the mask; and forming a second buried insulating film so as to fill the second lower opening.

In the manufacturing method thus arranged, the first and the second mask insulating films, provided so as to cover the respective inner wall of the first and the second upper openings, are utilized as the mask to form the first and the second lower openings in the first layer, which is to serve as an interconnect. Then the first and the second lower openings are filled with the first and the second buried insulating films, respectively. Such method allows forming an interconnect having a line width and a space width that are narrower than the line width and the space width of the photoresist employed for forming the first and the second upper openings.

Accordingly, the present invention provides a method of manufacturing a semiconductor device that includes an interconnect of a micronized scale, without incurring an increase in manufacturing cost.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1A:
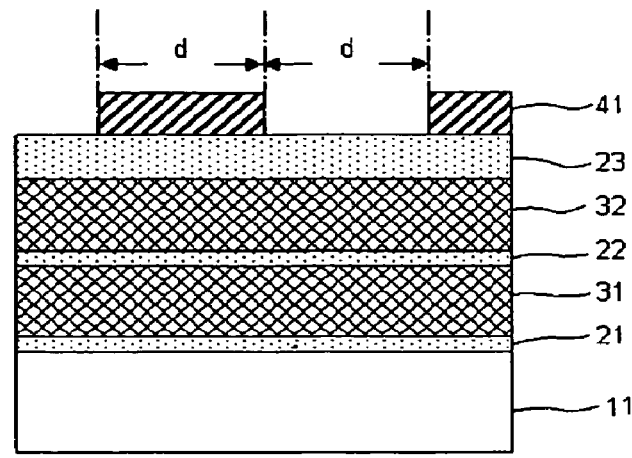
FIGS. 1A to 1D are schematic cross-sectional views showing a manufacturing process of a semiconductor device according to the first embodiment of the present invention.

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of the method of manufacturing a semiconductor device according to the present invention will be described in details, referring to the accompanying drawings. In the drawings, same constituents are given the same numerals, and description thereof will be omitted where appropriate.

First Embodiment

FIGS. 1A to 1D and 2A to 2D are schematic cross-sectional views showing a manufacturing process of a semiconductor device according to the first embodiment of the present invention. According to this embodiment, firstly a semiconductor substrate 11 having a conductive film 31 (first layer), an insulating film 22 (second layer) and another conductive film 32 (third layer) sequentially formed thereon (preparation step) (FIG. 1A). To be more detailed, the conductive film 31 is formed on the semiconductor substrate 11 with the insulating film 21 intervening therebetween, and on the conductive film 31 the insulating film 22 and the conductive film 32 are sequentially formed. Further, on the conductive film 32 an insulating film 23 is provided. The semiconductor substrate 11 may be a silicon substrate. The insulating films 21, 22, 23 may be an oxide film. The insulating film 21 may be formed by a thermal oxidation process. The conductive films 31, 32 may be a doped polycrystalline silicon film, which may be formed by CVD. The conductive film 32 has etching selectivity from the insulating film 22.

Figure 1B:
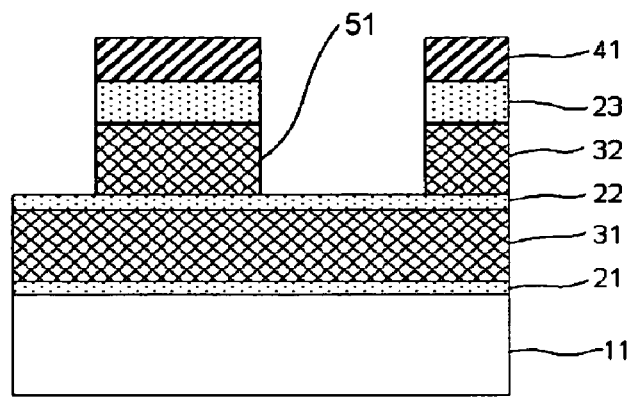

Then a photolithography process is carried out to delineate a pattern on a photoresist 41 provided on the insulating film 23. Here, the line width and the space width of the photoresist 41 are both represented by d. Meanwhile, an anti-reflection film (not shown) may be formed on the insulating film 23 prior to the formation of the photoresist 41. Then an etching process is performed on the insulating film 23 and the conductive film 32 utilizing the photoresist 41 as the mask, so as to form an opening 51 (first upper opening) in the conductive film 32 (first upper opening formation step) (FIG. 1B). A dry etching process may be employed in this step.

Figure 1C:
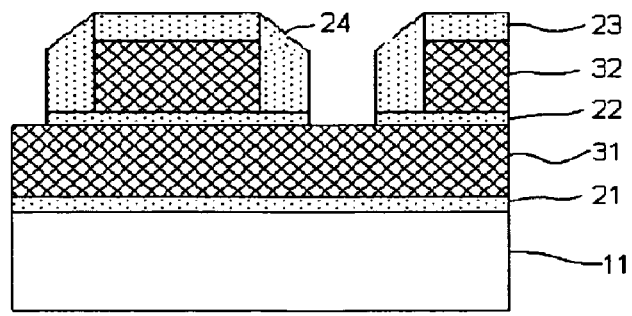
Figure 1D:
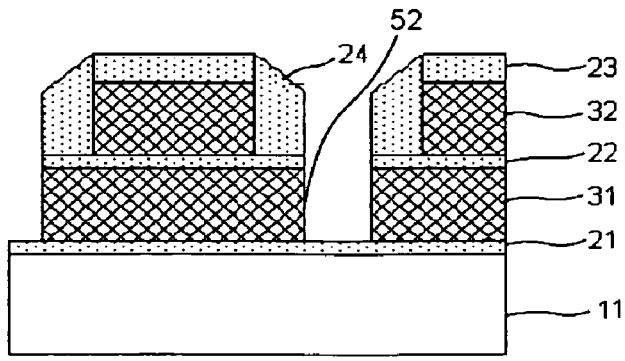

After removing the photoresist 41, an insulating film 24 (first mask insulating film) is formed all over the substrate. This is followed by an etchback process performed on the insulating film 24 so as to expose a surface of the conductive film 31, to thereby cover the inner wall of the opening 51 with the insulating film 24 (first mask insulating film formation step) (FIG. 1C). The insulating film 24 may be an oxide film, which may be formed by CVD. The etchback for the insulating film 24 may be carried out by an anisotropic dry etching process. Then an etching process is performed on the conductive film 31 utilizing the insulating film 24 as the mask, so as to form an opening 52 (first lower opening) in the conductive film 31 (first lower opening formation step). The opening 52 is located so as to communicate with the opening 51 (FIG. 1D).

Figure 2A:
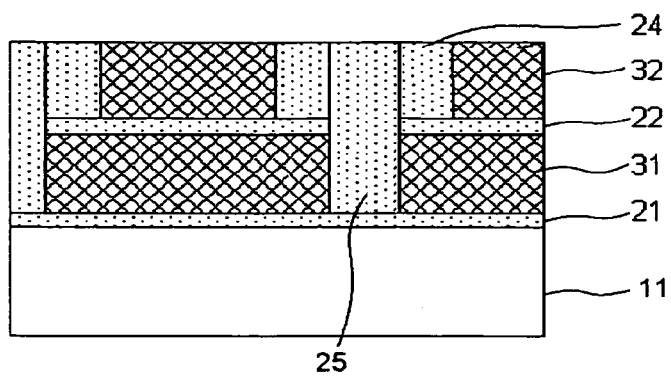
FIGS. 2A to 2D are schematic cross-sectional views showing the manufacturing process of a semiconductor device according to the first embodiment of the present invention.

Thereafter, an insulating film 25 (first buried insulating film) is formed all over. This is followed by an etchback process performed on the insulating film 25 so as to expose a surface of the conductive film 32, to thereby fill the opening 52 with the insulating film 25 (first buried insulating film formation step). At this stage, the opening 51 is also filled with the insulating films 24, 25 (FIG. 2A). The insulating film 25 may be an oxide film, which may be formed by CVD. The etchback process for the insulating film 25 may be performed by CMP (Chemical Mechanical Polishing).

Figure 2B:
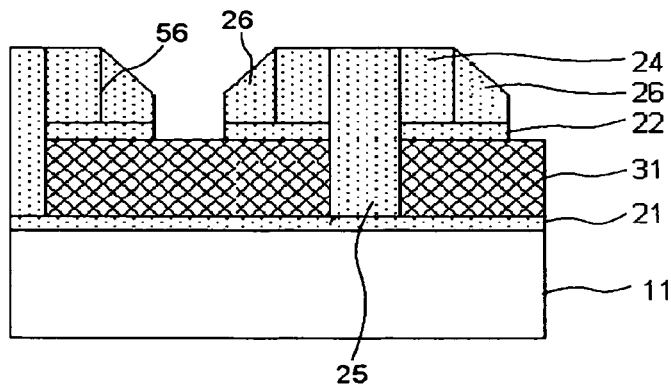

Then for example an isotropic dry etching process is performed to selectively remove the conductive film 32. This creates an opening 56 (second upper opening) at a position where a portion of the conductive film 32 has been removed (second upper opening formation step). Thereafter, an insulating film 26 (second mask insulating film) is formed all over, and the insulating film 26 is etched back so as to expose a surface of the conductive film 31, to thereby cover the inner wall of the opening 56 with the insulating film 26 (second mask insulating film formation step) (FIG. 2B). The insulating film 26 may be an oxide film, which may be formed by CVD. The etchback process for the insulating film 26 may be carried out by an anisotropic dry etching process.

Figure 2C:
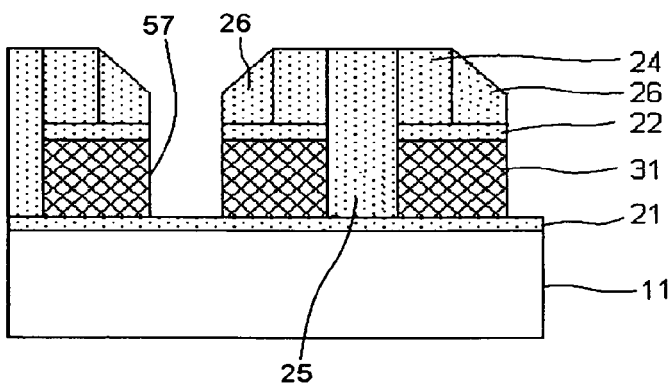
Figure 2D:
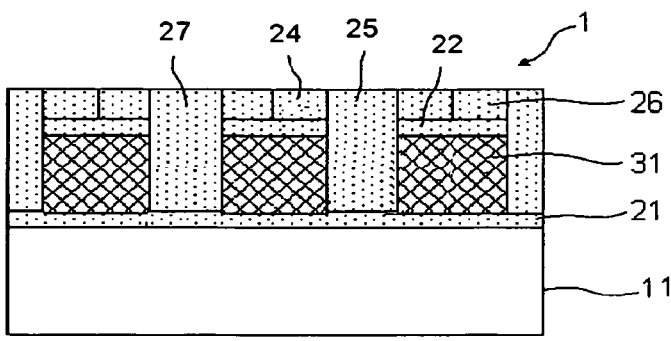

Then an etching process is performed on the conductive film 31 utilizing the insulating film 26 as the mask, so as to form an opening 57 (second lower opening) in the conductive film 31 (second lower opening formation step). The opening 57 is located so as to communicate with the opening 56 (FIG. 2C). After forming an insulating film 27 (second buried insulating film) all over, the insulating films 25, 27 are etched back for example by CMP, so as to fill the opening 57 with the insulating film 27 (second buried insulating film formation step). Throughout the foregoing steps, a semiconductor device 1 including an interconnect constituted of the conductive film 31 can be obtained (FIG. 2D). In the semiconductor device 1, the interconnects are separated from each other by the insulating films 25, 27, which define the space width between the interconnects.

The manufacturing method according to the foregoing embodiment offers the following advantages. The insulating films 24, 26, formed so as to cover the respective inner wall of the openings 51, 56, are utilized as the mask for the formation of the openings 52, 57, in the conductive film 31 which is to constitute the interconnect. Then the openings 52, 57 are filled with the insulating films 25, 27 respectively. Such method allows forming an interconnect having a narrower space width than the line width and the space width d (see FIG. 1A) of the photoresist 41 employed for forming the openings 51, 56. Further, since the distance between the insulating film 25 and the insulating film 27 can be made narrower than the width d, the line width of the interconnect can also be narrower than d. Accordingly, the manufacturing method according to this embodiment allows forming the interconnect in a finer scale beyond the resolution of an available exposure equipment, thus facilitating the micronization of the interconnect without incurring an increase in manufacturing cost. Consequently, the method according to the present invention permits achieving the micronization and higher-level integration of semiconductor elements without incurring an additional cost.

Figure 3A:
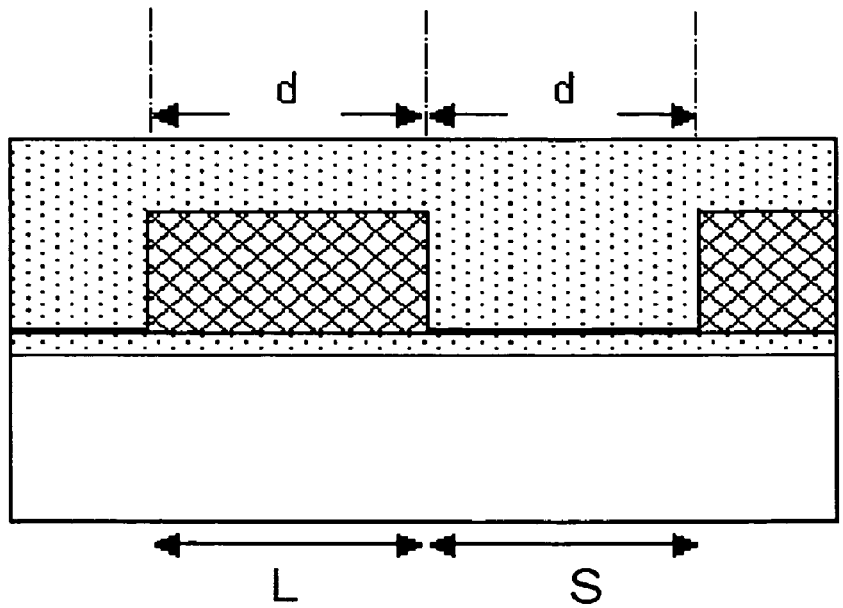
FIGS. 3A and 3B are schematic cross-sectional views for explaining the advantage of the first embodiment.

On the other hand, by the foregoing conventional manufacturing method, the line width L and the space width S of the interconnect can only be equal to the line width d of the photoresist, as shown in FIG. 3A. As long as the line width and the space width of the interconnect depend on the performance level of the photolithography, there can be no method of forming the interconnect in a narrower line width and space width than the minimum line width and space width of the photoresist, which are delimited by the resolution of the exposure equipment. Under such circumstance, an expensive, state-of-the-art exposure equipment provided with a light source of an extremely short wavelength has to be employed to achieve the micronization of the interconnect, which naturally incurs an increase in manufacturing cost.

Figure 3B:
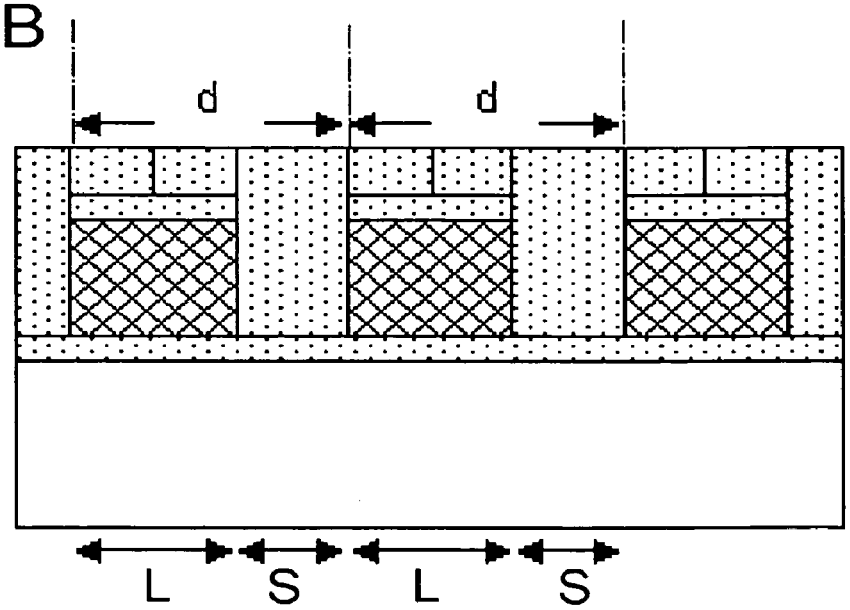

According to the foregoing embodiment, however, the interconnect can be formed in a narrower line width and space width than the minimum line width and space width of the photoresist, as shown in FIG. 3B. More specifically, while just a pair of line and space is included in a width corresponding to 2d in FIG. 3A, two pairs of line and space are included in the same width in FIG. 3B. Therefore, the manufacturing method according to this embodiment allows achieving the micronization of the interconnect without employing an expensive, state-of-the-art exposure equipment, thus to manufacture a semiconductor device that includes a micronized interconnect without incurring an additional cost.

Further, since the opening 56 is formed by removing the conductive film 32 remaining after the first buried insulating film formation step, the opening 56 can be self-aligned in a predetermined position.

In addition, providing the anti-reflection film on the insulating film 23 improves the exposure stability in the photolithography process for forming the photoresist 41.

It is to be noted that Patent Document 1 proposes delineating a pattern on the photoresist 141 so that the space width should become equal to the line width d instead of three times thereof. In this case, according to the document, an $O_2$ gas is employed for causing the photoresist to isotropically retreat, so as to widen the space width of the photoresist to three times of the line width. It is true that causing thus the photoresist pattern to isotropically retreat can make the line width d narrower than the minimum width delimited by the resolution of the exposure equipment. This method, however, has a disadvantage that the photoresist becomes so thin that the photoresist can no longer serve as the mask for the etching process. On the other hand, making the photoresist thicker leads to an increase in the above-mentioned minimum width itself, which incurs a reverse effect on the micronization of the line width d.

Figure 7A:
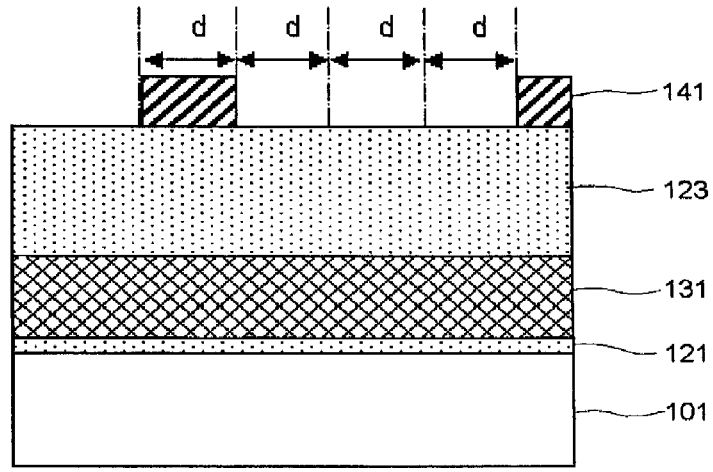
FIGS. 7A to 7C are schematic cross-sectional views showing the manufacturing method of a semiconductor device according to Patent Document 1.
Figure 7B:
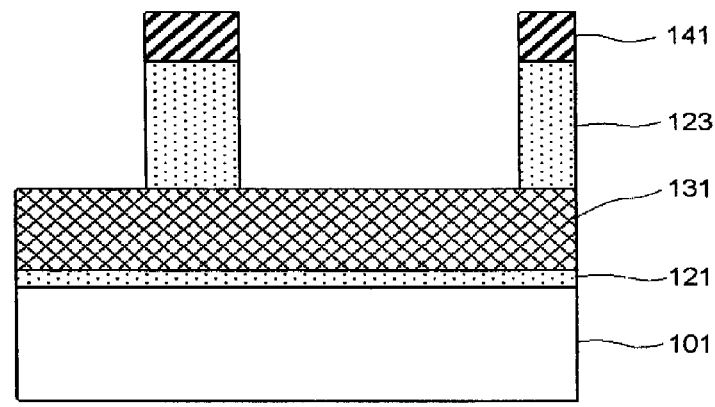
Figure 7C:
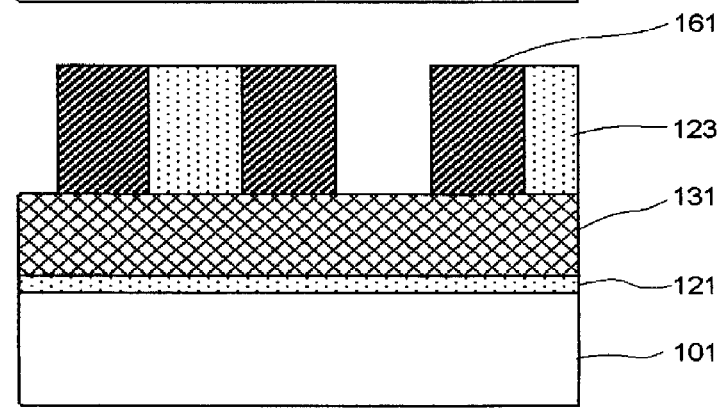
Figure 8A:
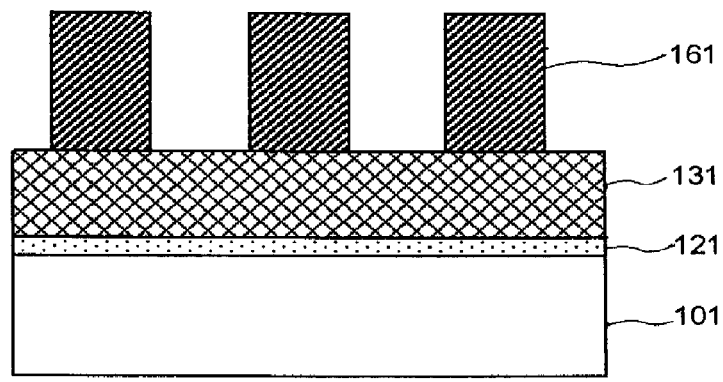
FIGS. 8A to 8C are schematic cross-sectional views showing the manufacturing method of a semiconductor device according to Patent Document 1.
Figure 8B:
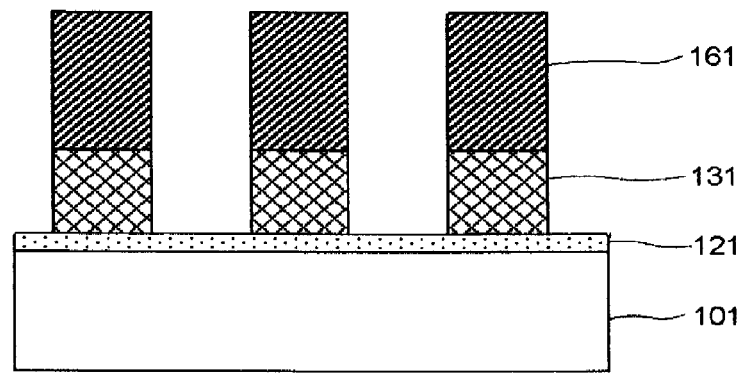
Figure 8C:
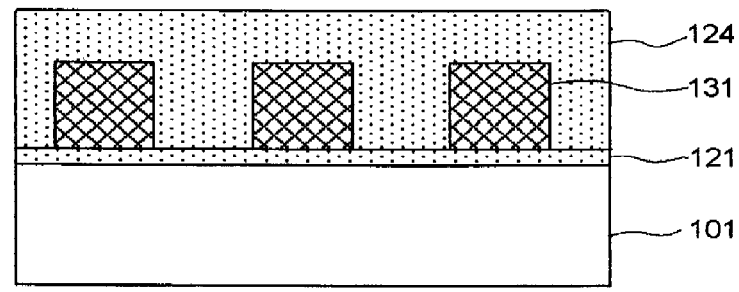

Further, the method according to the document may incur a pattern collapse of the insulating film 123, because the pattern is formed in a fine scale with the narrow insulating film 123 constituted of an oxide film, as shown in FIG. 7B. This leads to a lower yield. On the other hand, the method according to this embodiment is based on forming a narrow space, and hence free from such disadvantage and provides higher yield.

Second Embodiment

FIGS. 4A to 4C and 5A to 5C are schematic cross-sectional views showing a manufacturing process of a semiconductor device according to the second embodiment of the present invention. In this embodiment, firstly the preparation step, the first upper opening formation step and the first mask insulating film formation step are sequentially performed. These steps are similar to those described referring to FIG. 1A to 1C.

Figure 4A:
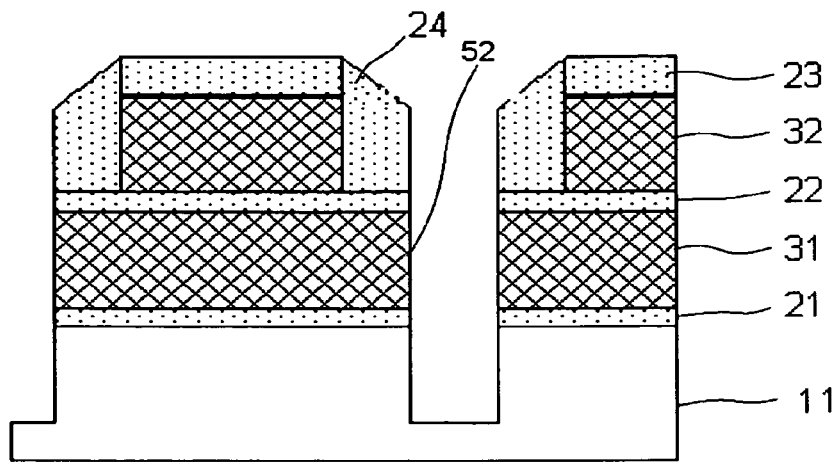
FIGS. 4A to 4C are schematic cross-sectional views showing a manufacturing process of a semiconductor device according to the second embodiment of the present invention.

The above is followed by an etching process performed on the conductive film 31 with the insulating film 24 utilized as the mask, so as to form the opening 52 in the conductive film 31. At this stage, the etching is also performed over the insulating film 21 and the semiconductor substrate 11, in addition to the conductive film 31 in this embodiment, so that the opening 52 is extended to an inner region of the semiconductor substrate 11 (first lower opening formation step) (FIG. 4A).

Figure 4B:
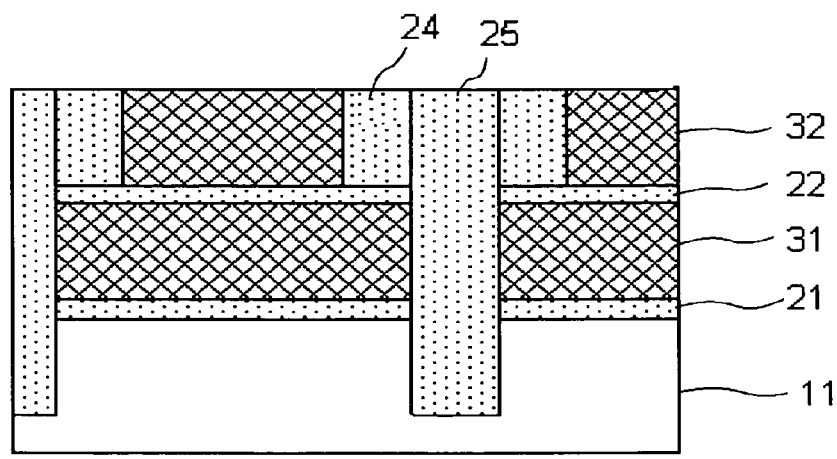
Figure 4C:
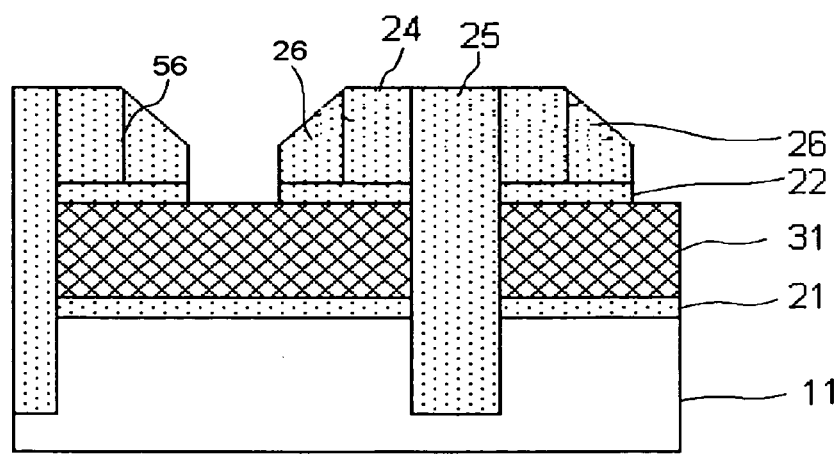

Then the insulating film 25 is formed all over. This is followed by an etchback process performed on the insulating film 25 so as to expose a surface of the conductive film 32, to thereby fill the opening 52 with the insulating film 25 (first buried insulating film formation step). At this stage, the opening 51 is also filled with the insulating films 24, 25 (FIG. 4B). Then the conductive film 32 is selectively removed so as to form the opening 56 (second upper opening formation step), and the insulating film 26 is formed all over, which is etched back so as to expose a surface of the conductive film 31, to thereby cover the inner wall of the opening 56 with the insulating film 26 (second mask insulating film formation step) (FIG. 4C).

Figure 5A:
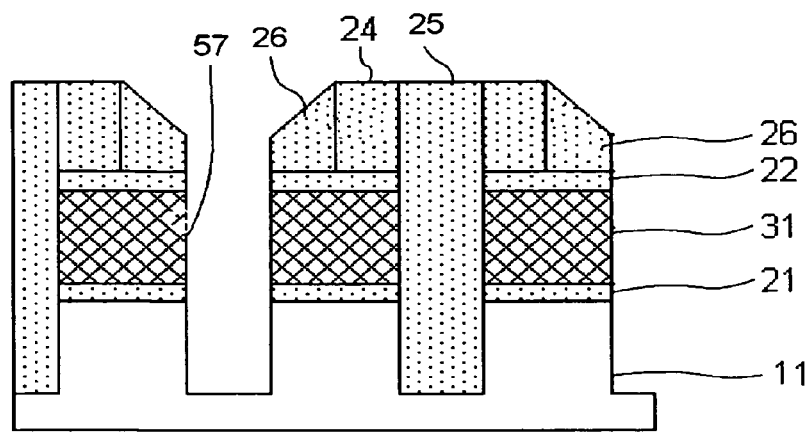
FIGS. 5A to 5C are schematic cross-sectional views showing the manufacturing process of a semiconductor device according to the second embodiment of the present invention.

Then an etching process is performed on the conductive film 31 utilizing the insulating film 26 as the mask, so as to form an opening 57 in the conductive film 31. At this stage, the etching is also performed over the insulating film 21 and the semiconductor substrate 11, in addition to the conductive film 31 in this embodiment, so that the opening 57 is extended to an inner region of the semiconductor substrate 11 (second lower opening formation step) (FIG. 5A). After forming the insulating film 27 all over, the insulating films 25, 27 are etched back for example by CMP so as to expose a surface of the conductive film 31, to thereby fill the opening 57 with the insulating film 27 (second buried insulating film formation step).

Figure 5B:
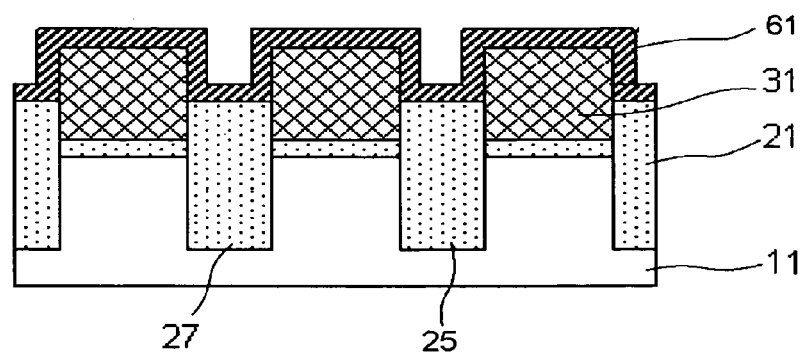
Figure 5C:
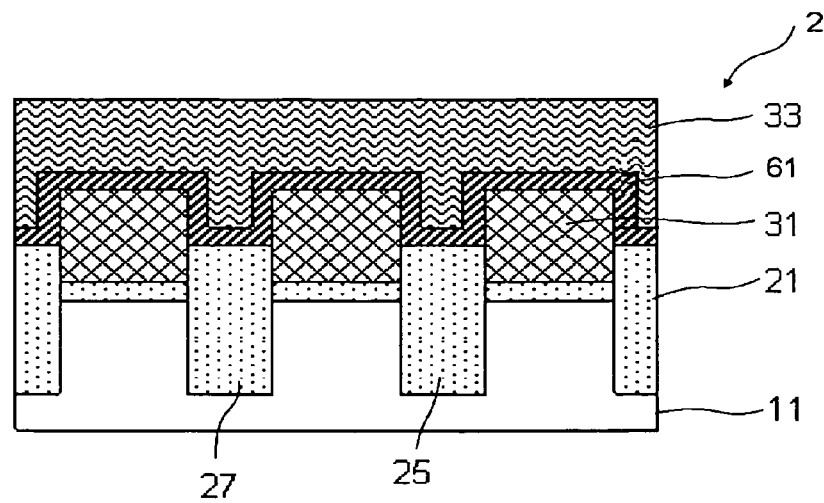
Figure 6A:
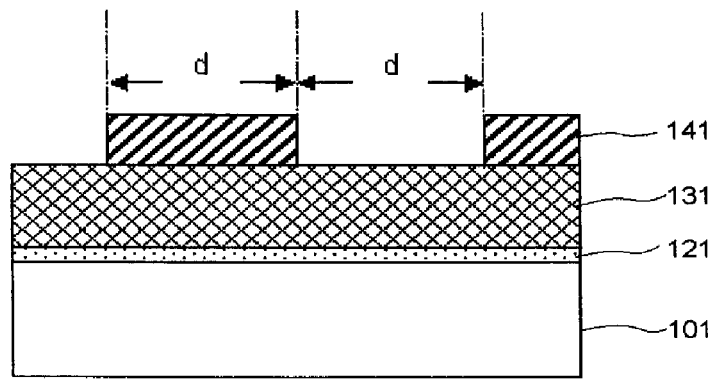
FIGS. 6A to 6C are schematic cross-sectional views showing a conventional manufacturing process of a semiconductor device.
Figure 6B:
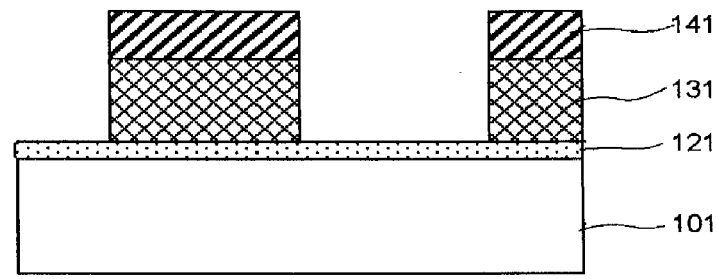
Figure 6C:
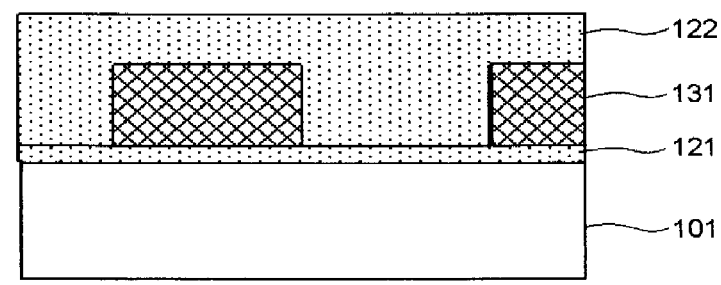

In this embodiment, a portion of each of the insulating films 25, 27 is removed, so that the surfaces thereof recede with respect to the surface of the conductive film 31 (buried insulating film removal step). The removal step may be carried out by a wet etching process so as to etchback a portion of each of the insulating films 25, 27. After that, for example a CVD process is performed to form an insulating film 61 (fourth layer) so as to cover the exposed surfaces of the insulating films 25, 27 and of the conductive film 31 (FIG. 5B). The insulating film 61 may be a multilayer insulating film including an oxide film, a nitride layer and another oxide film sequentially stacked. Then a conductive film 33, constituted for example of a doped polycrystalline silicon film, is formed all over the insulating film 61 (fifth layer formation step). Throughout the foregoing steps, a semiconductor device 2 including an interconnect constituted of the conductive film 31 can be obtained (FIG. 5C).

The manufacturing method according to the foregoing embodiment offers the following advantages. In this embodiment too, the insulating films 24, 26, formed so as to cover the respective inner wall of the openings 51, 56, are utilized as the mask for the formation of the openings 52, 57, in the conductive film 31 which is to constitute the interconnect. Then the openings 52, 57 are filled with the insulating films 25, 27 respectively. Such method allows forming an interconnect having a narrower line width and space width than the line width and the space width d of the photoresist 41 employed for forming the openings 51, 56. Accordingly, the manufacturing method according to this embodiment allows forming the interconnect in a finer scale beyond the resolution of an available exposure equipment, thus facilitating the micronization of the interconnect without incurring an increase in manufacturing cost.

Further, since the openings 52, 57 are formed so as to extend into an inner region of the semiconductor substrate 11, an isolation region can be formed in a self-aligning manner, with respect to the conductive film 31 constituting a fine interconnect electrode.

Further, the second buried insulating film formation step is followed by the buried insulating film removal step and the fifth layer formation step. Such arrangement provides a memory transistor for which the conductive film 31 serves as a floating gate electrode and the conductive film 33 serves as a control gate electrode. These steps may be performed in the former embodiment. More specifically, the second buried insulating film formation step described referring to FIG. 2D may be sequentially followed by the buried insulating film removal step and the fifth layer formation step.

The method of manufacturing a semiconductor device according to the present invention is not limited to the foregoing embodiments, but may be modified in various manners. To cite a few examples, the conductive films 31, 32, 33 may be constituted of a silicide film or a metal film, instead of the polycrystalline silicon film. Further, a multi-layer film constituted of two or more stacked layers such as the polycrystalline silicon film, the silicide film, and the metal film may be employed as the conductive films 31, 32, 33.

Further, it is not imperative to employ the conductive film 32 as the third layer. In other words, an insulating film may be employed as the third layer in place of the conductive film 32, as long as that insulating film has etching selectivity from the insulating film 22. For instance, when the insulating film 22 is an oxide film, a nitride layer may be employed as the third layer.

Still further, provided that the third layer has etching selectivity from the conductive film 31, it is not imperative to provide the insulating film 23, but the photoresist 41 may be formed directly over the third layer.

It is apparent that the present invention is not limited to the above embodiment, and may be modified and changed without departing from the scope and spirit of the invention.

What is claimed is:

1. A method of manufacturing a semiconductor device, comprising:
    preparing a semiconductor substrate on which a first layer constituted of a conductive film, a second layer constituted of an insulating film, and a third layer having etching selectivity from said second layer are sequentially formed;
    forming a first upper opening in said third layer;
    forming a first mask insulating film so as to cover an inner wall of said first upper opening;
    forming a first lower opening in said first layer so as to communicate with said first upper opening, utilizing said first mask insulating film as the mask;
    forming a first buried insulating film so as to fill said first lower opening;
    forming a second upper opening by selectively removing said third layer by etching, after said forming of said first buried insulating film;
    forming a second mask insulating film so as to cover an inner wall of said second upper opening;
    forming a second lower opening in said first layer so as to communicate with said second upper opening, utilizing said second mask insulating film as the mask; and
    forming a second buried insulating film so as to fill said second lower opening.

2. The method according to claim 1,
    wherein said forming said first lower opening includes forming said first lower opening so as to extend into an inner region of said semiconductor substrate; and
    said forming said second lower opening includes forming said second lower opening so as to extend into an inner region of said semiconductor substrate.

3. The method according to claim 1, further comprising:
    removing a portion of each of said first and second buried insulating films so that surfaces of said first and second buried insulating films should recede with respect to a surface of said first layer, after said forming of said second buried insulating film; and
    forming a fifth layer constituted of a conductive film on said first layer and said first and second buried insulating films with a fourth layer constituted of an insulating film intervening, after said removing of said portion of each of said first and second buried insulating films.

* * * * *